(12) United States Patent
Yamamoto

(10) Patent No.: US 7,446,059 B2
(45) Date of Patent: Nov. 4, 2008

(54) SEMICONDUCTOR DEVICE AND METHOD FOR MANUFACTURING SAME

(75) Inventor: Ichiro Yamamoto, Kawasaki (JP)

(73) Assignee: NEC Electronics Corporation, Tokyo (JP)

( * ) Notice: Subject to any disclaimer, the term of this patent is extended or adjusted under 35 U.S.C. 154(b) by 307 days.

(21) Appl. No.: 11/180,648

(22) Filed: Jul. 14, 2005

(65) Prior Publication Data

US 2006/0003599 A1 Jan. 5, 2006

Related U.S. Application Data

(62) Division of application No. 10/746,342, filed on Dec. 29, 2003, now Pat. No. 6,936,901.

(30) Foreign Application Priority Data

Dec. 27, 2002 (JP) .............................. 2002-381216

(51) Int. Cl.
  *H01L 21/31* (2006.01)
  *H01L 21/469* (2006.01)
(52) U.S. Cl. ............... 438/785; 438/778; 257/E21.625; 257/E21.159
(58) Field of Classification Search ............ 438/785, 438/778; 257/E21.159, E21.21, E21.266, 257/E21.625
See application file for complete search history.

(56) References Cited

U.S. PATENT DOCUMENTS 6,586,349 B1 * 7/2003 Jeon et al. ................... 438/785

2002/0137250 A1 * 9/2002 Nguyen et al. ................ 438/53
2003/0003667 A1   1/2003 Morisaki et al.
2004/0046497 A1 * 3/2004 Schaepkens et al. ........ 313/506

FOREIGN PATENT DOCUMENTS

JP      2002-314072 A      10/2002

* cited by examiner

*Primary Examiner*—Caridad M Everhart
(74) *Attorney, Agent, or Firm*—Sughrue Mion, PLLC

(57) ABSTRACT

A semiconductor device is provided which is capable of improving its reliability by using a material having a high relative dielectric constant as a material for its gate insulating film, by suppressing degradation of an EOT (Equivalent Oxide Thickness) and by preventing crystallization of the material having a high relative dielectric constant. The semiconductor device (Field Effect Transistor) has a silicon substrate, a seed layer made up of silicon oxide, a gate insulating film made of amorphous hafnium aliminate and a gate electrode made up of polycrystalline silicon formed the gate insulating film. The gate insulating film is so formed that a hafnium concentration decreases monotonously or step by step, whereas an aluminum concentration increases monotonously or step by step along a direction of a thickness of the gate insulating film from the silicon substrate side toward the gate electrode. In a boundary region between a lower layer side region and an upper layer side region in the gate insulating film, the hafnium and aluminum concentrations change continuously.

13 Claims, 12 Drawing Sheets relation between distance from interface of gate insulating film on substrate side and hafnium concentration in gate insulating film distance "d" from interface of gate insulating film on substrate side

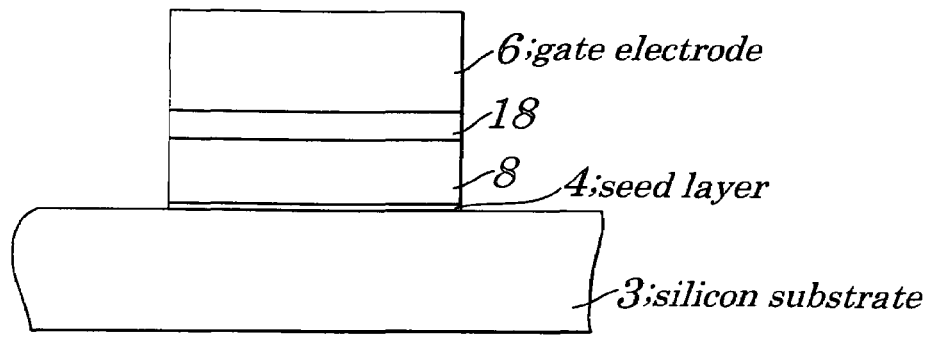
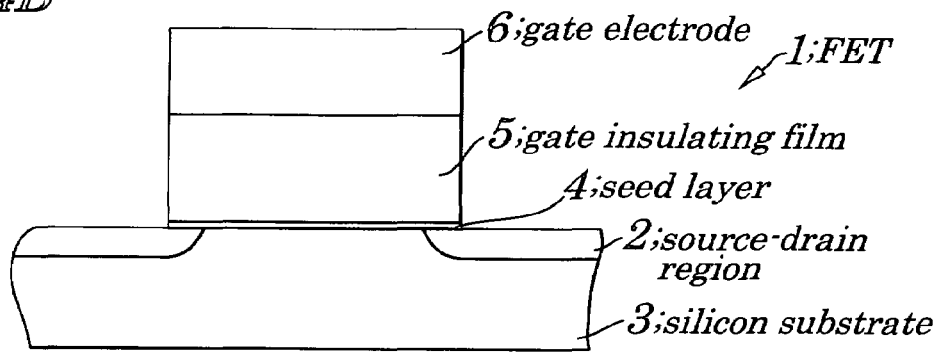
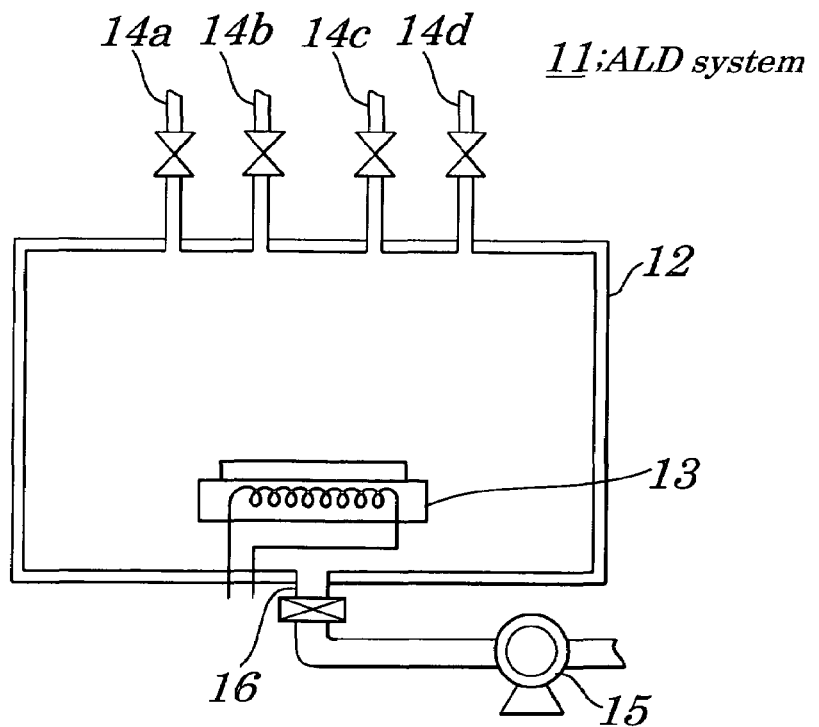

21;FET
26;gate electrode
25;gate insulating film
24;seed layer
22;source-drain region
23;silicon substrate 104; gate insulating film
101; FET
105; gate electrode
107; zirconium oxide layer
106; aluminum oxide layer
102; source-drain region
103; silicon substrate 201; FET
205; gate electrode
204; gate insulating film
202; source-drain region
203; silicon substrate

SEMICONDUCTOR DEVICE AND METHOD FOR MANUFACTURING SAME

This is a divisional of application Ser. No. 10/746,342 filed Dec. 29, 2003, now U.S. Pat. No. 6,936,901 the entire disclosure of which is incorporated herein by reference.

BACKGROUND OF THE INVENTION

1. Field of the Invention

The present invention relates to a semiconductor device and a method for manufacturing the same, and more particularly to an MIS (Metal Insulator Semiconductor)-type semiconductor device in which a gate electrode made of, for example, polycrystalline silicon is formed on a silicon substrate with a gate insulating film made of amorphous aluminate, and being sandwiched between the gate electrode and the silicon substrate, and to the method for manufacturing the same.

The present application claims priority of Japanese Patent Application No. 2002-381216 filed on Dec. 27, 2002, which is hereby incorporated by reference.

2. Description of the Related Art

In recent years, to satisfy a need for scale-down and high integration of a semiconductor device, when silicon oxide ($SiO_2$) is used as a gate insulating film, it is necessary to reduce its film thickness of, for example, an FET (Field Effect Transistor) to several nanometers or less. However, a problem arises that, if the gate insulating film is made so extremely thin, a tunnel current flowing when a gate bias is applied becomes so large, compared with a source-drain current, that it cannot be neglected. To solve this problem, a method is proposed in which, by using an insulator material having a relative dielectric constant being higher than that of silicon oxide, a gate insulating film practically and effectively made thin. For example, a method for manufacturing an FET is disclosed in, for example, Japanese Patent Application Laid-open No. 2002-314072 in which zirconium oxide having a relative dielectric constant $\epsilon_r$ being about 30 is used as a material for a gate insulating film instead of silicon oxide (see FIG. 15). The disclosed FET 101, as shown in FIG. 15, has a silicon substrate 103 on which a source-drain region 102 is formed, a gate insulating film 104 being deposited on the silicon substrate 103, and a gate electrode 105 made of polycrystalline silicon (poly-Si) formed on the gate insulating film 104. In the technology, an aluminum oxide layer 106 is deposited on the silicon substrate 103, serving as a seed layer, and a zirconium oxide layer 107 is deposited on the aluminum oxide layer 106. As shown in FIG. 15, in manufacturing the FET 101, the gate insulating film 104 as multilayer is formed on the silicon substrate 103, by depositing in sequence and stacking the aluminum oxide layer 106 and zirconium oxide layer 107 both being amorphous on the silicon substrate 103.

Also, another method for manufacturing an FET 201 is proposed, as shown in FIG. 16, in which hafnium oxide having a relative dielectric constant $\epsilon_r$ being about 20 is used as the material for the gate insulating film. The FET 201, as shown in FIG. 16, has a silicon substrate 203 on which a source-drain region 202 is formed, a gate insulating film 204 made of hafnium oxide being deposited on the silicon substrate 203, and a gate electrode 205 formed directly on the gate insulating film 204. To manufacture the FET 201, a hafnium oxide layer is deposited on the silicon substrate 203 to form the gate insulating film 204.

Here, a film thickness considering the relative dielectric constant of metal oxide is simply called an "EOT" (Equivalent Oxide Thickness). As shown by a characteristic curve "Lp" in FIG. 17, a relation between the EOT and a leakage current density obtained when a metal is used as a material for the gate electrode 205 in the FET 201 in FIG. 16 is excellent. In FIG. 17, a characteristic curve "Lq" shows a relation between the EOT and the leakage current density obtained when polycrystalline silicon is used as the material for the gate electrode 205. Also, in FIG. 17, a characteristic curve "Lr" shows a relation between the EOT and the leakage current density obtained when polycrystalline silicon is used as the material for the gate electrode 205 and the gate insulating film 204 is made up of only aluminum oxide and a characteristic curve "Ls" shows a relation between the EOT and the leakage current density obtained when polycrystalline silicon is used as the material for the gate electrode 205 and the gate insulating film 204 is made up of only silicon oxide.

Moreover, when metals as described above are used as the materials for the gate electrode 205, though an experiment on only such the characteristic as the relation between the EOT and leakage current density shows good results, the metals cannot be practically employed due to following reasons. That is, in an LSI (Large Scale Integrated Circuit), two kinds of FETs (Field Effect Transistors), one being an nMOSFET (n-type Metal Oxide Semiconductor FET) and another being a pMOSFET (p-type MOSFET). Therefore, it is necessary to form gate electrodes each having a different work function on a same wafer at the same time. When polycrystalline silicon or germanium polycrystalline silicon is used as a material for the gate electrode, by performing a doping process, the work function of the gate electrode can be changed. However, if metals are used as the material for the gate electrode, since a work function cannot be changed, there is a difficulty in manufacturing a CMOS (Complementary MOS). Also, generally, if metals are used as a material for the gate electrode, the gate insulating film is easily short-circuited due to a reaction between the gate electrode and gate insulating film caused by heat treatment for source/drain activation. To solve this problem, by using polycrystalline silicon or a like as the material for the gate electrode and, at the same time, by using a material having a high relative dielectric constant as the material for the gate insulating film, an effort to obtain the excellent characteristic (the relation between the EOT and leakage current density) is made.

However, this method has also a problem in that, if zirconium oxide is used as the material for the gate insulating film, crystallization of amorphous zirconium oxide occurs due to heat treatment in a process of forming the gate electrode 105 or of forming the source/drain region 102, or if polycrystalline silicon is used as the material for the gate electrode 105, a short-circuit is made due to incompatibility with zirconium oxide. Moreover, an another problem arises that, if hafnium oxide is used as the material for the gate insulating film, crystallization of the hafnium oxide easily occurs due to heat treatment which causes occurrence of a grain boundary passing through higher and lower electrodes. These problems cause an increase in a leakage current leading to easy occurrence of dielectric breakdown and to reduction in reliability of semiconductor devices. Furthermore, if polycrystalline silicon is used as a material for the gate electrode, an electrostatic capacity becomes lower compared with the case where metals are used as the material for the gate electrode and, as shown by the characteristic curve "Lq" in FIG. 17, the EOT is greatly degraded compared with the case shown by the characteristic curve "Lp".

SUMMARY OF THE INVENTION

In view of the above, it is an object of the present invention to provide a semiconductor device which is capable of improving its reliability, even when a polycrystalline semiconductor such as a polycrystalline silicon or a like is used as a material for its gate electrode, by using a material having a high relative dielectric constant for a gate insulating film, by suppressing degradation of an EOT and by preventing crystallization of the material having a high relative dielectric constant, and a method for manufacturing the same.

According to a first aspect of the present invention, there is provided a semiconductor device of an MIS (metal insulator semiconductor)-type including:

a substrate;

an insulating film made of metal oxide being deposited on the substrate; and an electrode formed on the insulating film;

wherein the insulating film contains aluminum and hafnium and has a first insulating region formed in a vicinity of the substrate, the first insulating region being hafnium-rich, and a second insulating region formed in a vicinity of the electrode, the second insulating region being aluminum-rich.

In the foregoing, a preferable mode is one wherein the metal oxide is made of amorphous metal oxide and the electrode is made of a polycrystalline semiconductor.

Also, a preferable mode is one wherein the insulating film is so formed that a hafnium concentration becomes lower monotonously and an aluminum concentration becomes higher monotonously or step by step along a direction of a thickness of the insulating film from a side of the substrate toward a side of the electrode.

Also, a preferable mode is one wherein a third insulating region in which the hafnium concentration and the aluminum concentration change continuously along a direction of a thickness of the insulating film is formed between the first insulating region and the second insulating region.

Also, a preferable mode is one wherein an aluminum concentration and a hafnium concentration are set so that a ratio of hafnium atoms to a sum of a number of aluminum atoms and hafnium atoms in the first insulating region is 0.5 or more and 0.8 or less and an aluminum concentration and a hafnium concentration are set so that a ratio of aluminum atoms to a sum of a number of aluminum atoms and hafnium atoms in the second insulating region is 0.5 or more and 1.0 or less.

Also, a preferable mode is one wherein a ratio of a thickness of the second insulating region to a thickness of the first insulating region is set to be ⅓ or more and 1.0 or less.

Also, a preferable mode is one wherein a thickness of the insulating film is 2 nanometers or more and 5 nanometers or less.

Also, a preferable mode is one wherein a seed layer made of silicon oxide is sandwiched between the substrate and the insulating film.

According to a second aspect of the present invention, there is provided a method for manufacturing a semiconductor device including:

an insulating film forming process of forming an insulating film made of metal oxide containing aluminum and hafnium on a substrate; and an electrode forming process of forming an electrode on the insulating film;

wherein the insulating film forming process includes a first insulating film forming process of forming a first insulating film being hafnium-rich on the substrate and a second insulating film forming process of forming a second insulating film being aluminum-rich on the first insulating film and wherein, in the electrode forming process, the electrode is formed on the second insulating film.

In the foregoing, a preferable mode is one wherein the metal oxide to be used in the insulating film forming process is made of amorphous metal oxide and the electrode to be formed in the electrode forming process is made of a polycrystalline semiconductor.

Also, a preferable mode is one wherein, in the insulating film forming process, the insulating film is so formed that a hafnium concentration becomes lower monotonously and an aluminum concentration becomes higher monotonously or step by step along a direction of a thickness of the insulating film from a side of the substrate toward a side of the electrode.

Also, a preferable mode is one that wherein includes a third insulating film forming process of forming a third insulating film in which concentrations of hafnium and aluminum contained in the metal oxide change along a direction of a thickness of the insulating film between the first insulating, film and the second insulating film.

Also, a preferable mode is one wherein, in the first insulating film forming process, the first insulating film is so formed that a ratio of hafnium atoms to a sum of a number of aluminum atoms and hafnium atoms in the first insulating region is 0.5 or more and 0.8 or less and, in the second insulating film forming process, the second insulating film is so formed that a ratio of aluminum atoms to a sum of a number of aluminum atoms and hafnium atoms in the second insulating region is 0.5 or more and 1.0 or less.

Also, a preferable mode is one wherein a ratio of a thickness of the second insulating region to a thickness of the first insulating region is set to be ⅓ or more and 1.0 or less.

Also, a preferable mode is one wherein a thickness of the insulating film is 2 nanometers or more and 5 nanometers or less.

Also, a preferable mode is one that wherein a thermal treatment process of changing, at least continuously, the aluminum concentration and hafnium concentration along a direction of a thickness of the insulating film by performing the thermal treatment process after the electrode forming process.

Also, a preferable mode is one wherein, in the insulating film forming process, the insulating film is formed by an atomic-layer deposition (ALD) method.

Also, a preferable mode is one wherein, in the insulating film forming process, the insulating film is formed by a chemical vapor deposition (CVD) method.

Also, a preferable mode is one wherein the thermal treatment process is performed in an electrode forming process or in a source-drain region forming process after the electrode forming process.

Furthermore, a preferable mode is one that wherein includes a seed layer forming process of forming a seed layer made of silicon oxide on the substrate before the first insulating film forming process.

With the above configuration, the insulating film contains hafnium oxide being a high dielectric constant material as a compositional material and, therefore, by distributing hafnium while changing a concentration all over regions of the insulating film, lowering of a relative dielectric constant of the entire insulating films can be suppressed and the required EOT can be obtained.

With still another configuration, the concentration of aluminum is set to be comparatively high in a region having a specified thickness immediately below the electrode and, therefore, by using a polycrystalline semiconductor as a gate electrode, lowering in an EOT of the insulating film occurring when hafnium oxide is singly used as the insulating film can be suppressed, which enables electrostatic capacitance to be prevented from being lowered.

With still another configuration, aluminum is contained not only in the second insulating region but also in the first insulating region where hafnium is contained in a comparatively high concentration and, therefore, crystallization of hafnium oxide can be suppressed. As a result, occurrence of a grain boundary passing through the insulating film can be suppressed and an increase in leakage currents can be prevented. This enables dielectric breakdown to be avoided and reliability of semiconductor devices to be improved. Thus, since the crystallization of hafnium oxide can be suppressed, it is possible to improve surface roughness and to avoid local concentration of electric fields at regions having small thickness and to reduce leakage currents, which improve reliability of semiconductor devices.

With still another configuration, after the second insulating region has been stacked on the first insulating film, by performing the thermal treatment process, the concentrations of aluminum and hafnium can be changed continuously and, therefore, it is possible to prevent such a problem as a decrease in a threshold value caused by trapped electric charges in the boundary region.

With still another configuration, the ALD method is used to form the insulating film and, therefore, the concentration of aluminum and hafnium can be precisely controlled, thus improving quality of the insulating film and contamination caused by carbon contained in the material gas can be prevented by introducing the purge gas.

BRIEF DESCRIPTION OF THE DRAWINGS

The above and other objects, advantages, and features of the present invention will be more apparent from the following description taken in conjunction with the accompanying drawings in which:

FIGS. 4A and 4B are process diagrams illustrating a method for manufacturing the FET according to the first embodiment;

FIG. 5 is a diagram briefly showing an ALD (Atomic-Layer Deposition) system to be used for manufacturing the FET according to the first embodiment;

DETAILED DESCRIPTION OF THE PREFERRED EMBODIMENTS

Best modes of carrying out the present invention will be described in further detail using various embodiments with reference to the accompanying drawings.

First Embodiment

Figure 1:
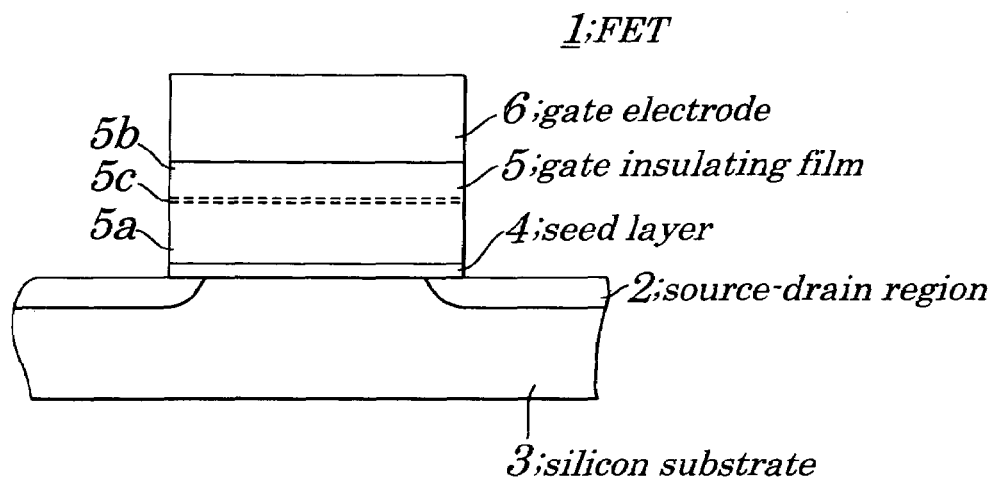
FIG. 1 is a cross-sectional view schematically illustrating featured configurations of an FET according to a first embodiment of the present invention.
Figure 2:
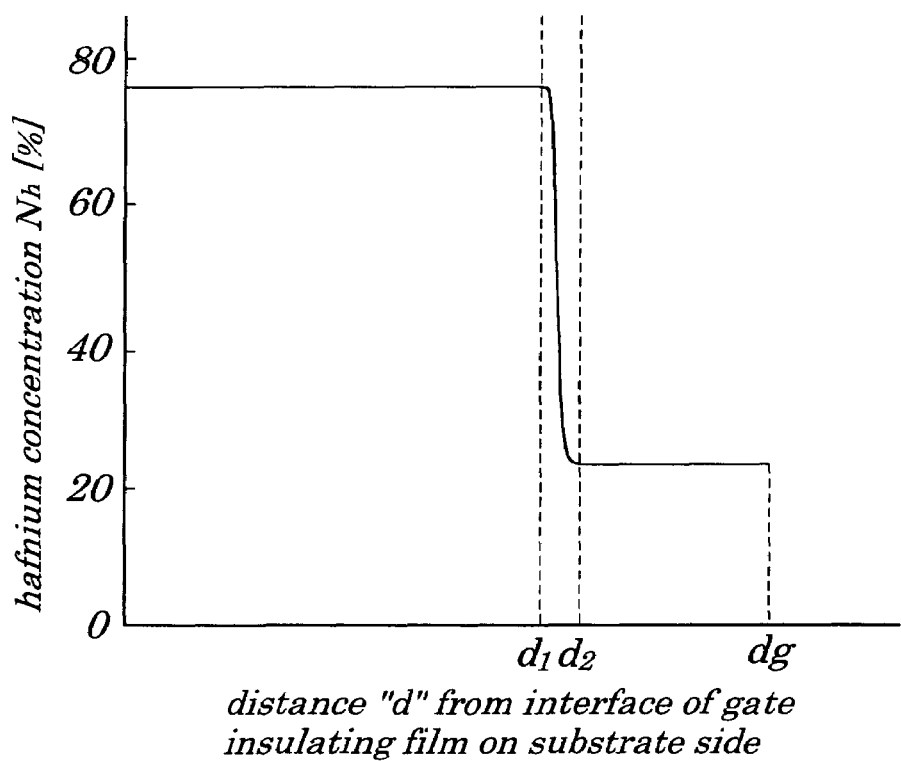
FIG. 2 is a characteristic diagram briefly showing a relation between a distance from an interface of a gate insulating film on a substrate side and a hafnium concentration obtained after heat treatment in a gate insulating film making up the FET according to the first embodiment of the present invention.
Figure 6:
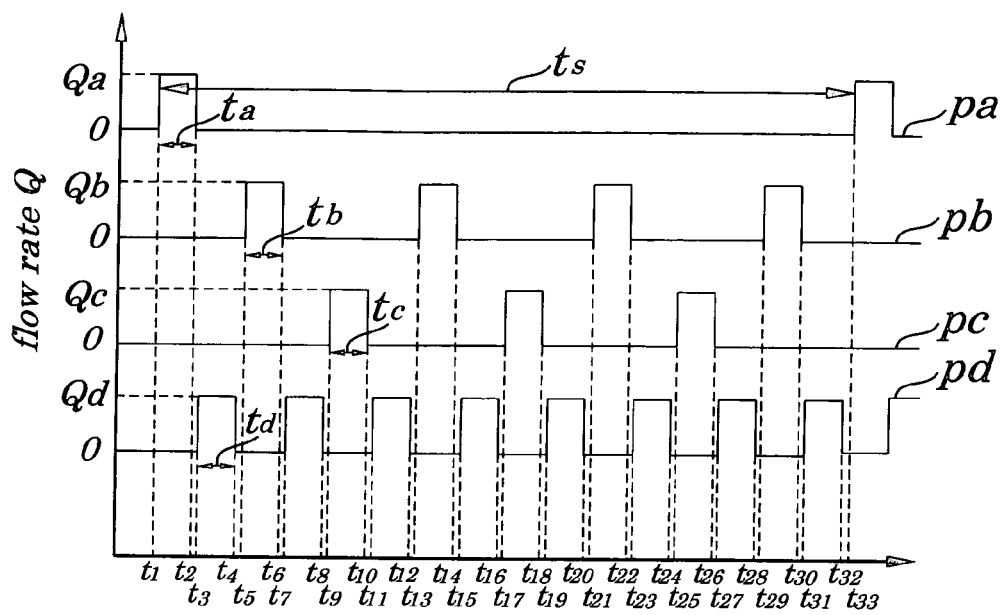
FIG. 6 is a diagram explaining a method for supplying material gas or a like employed in the ALD system of FIG. 5.
Figure 7:
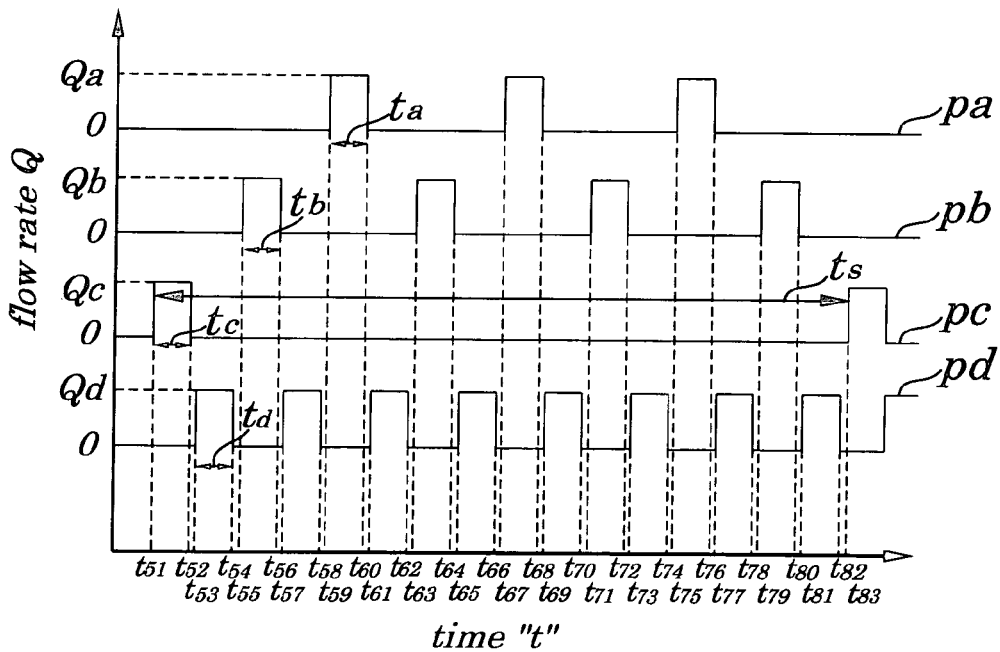
FIG. 7 is a diagram explaining subsequently a method for supplying material gas or a like employed in the ALD system of FIG. 5.
Figure 8:
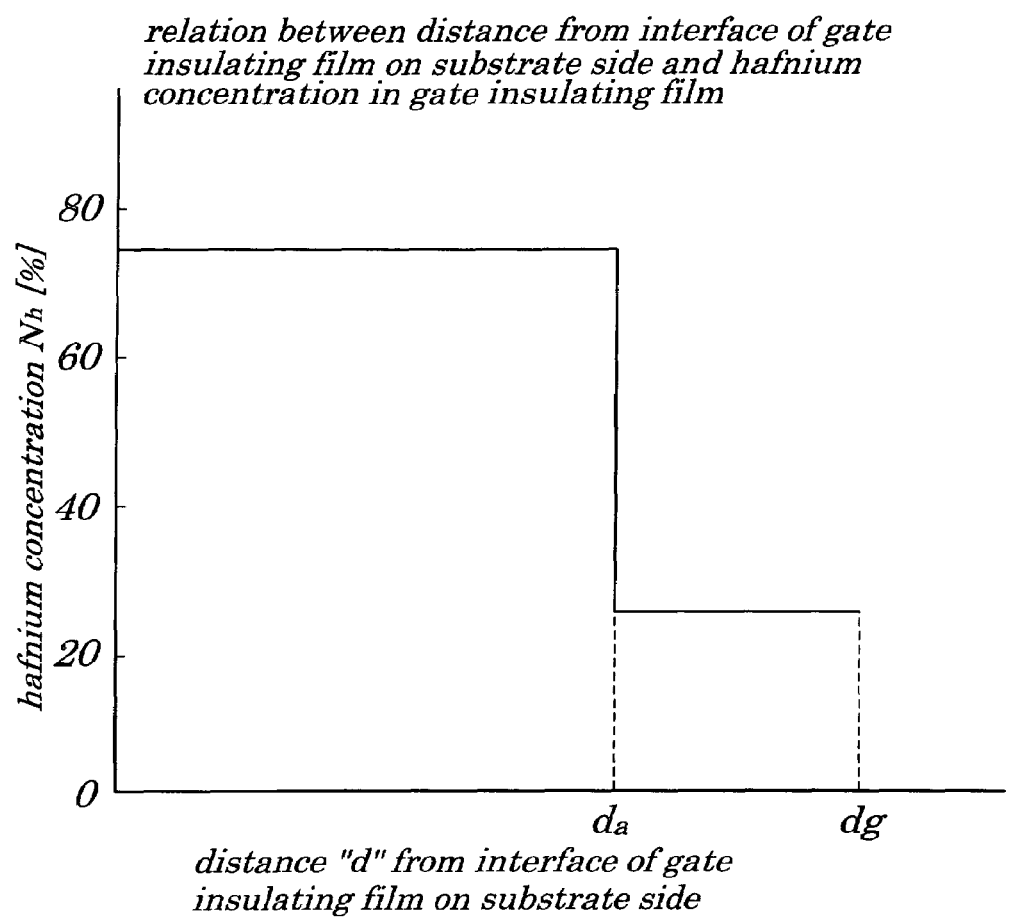
FIG. 8 is a characteristic diagram briefly showing a relation between a distance from an interface of a gate insulating film on a substrate side and a hafnium concentration obtained before heat treatment in the gate insulating film making up the FET according to the first embodiment.
Figure 9:
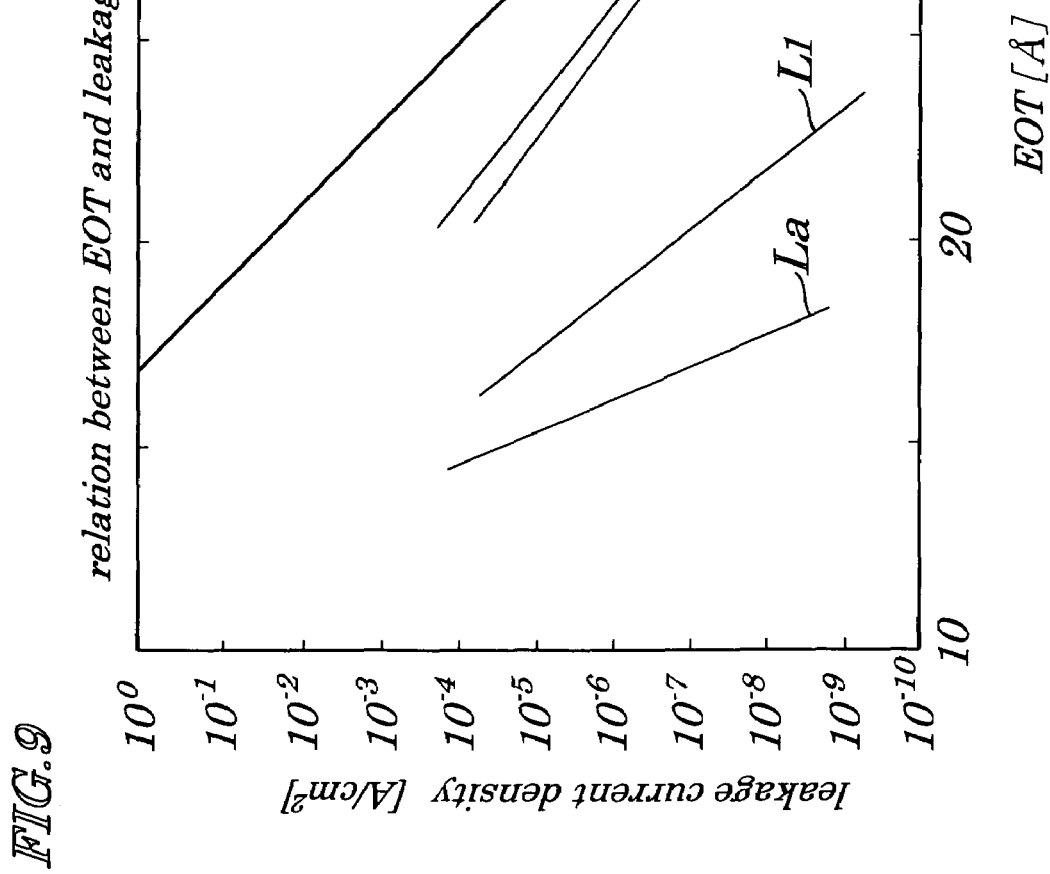
FIG. 9 is a diagram explaining characteristics of the FET according to the first embodiment.

FIG. 1 is a cross-sectional view for schematically illustrating featured configurations of an FET (Field Effect Transistor) according to a first embodiment of the present invention. FIG. 2 is a characteristic diagram briefly showing a relation between a distance from an interface of a gate insulating film on a side of a substrate and a hafnium concentration "Nh" obtained after heat treatment in a gate insulating film making up the FET according to the first embodiment. FIGS. 3A to 3D, and FIGS. 4A and 4B are process diagrams for illustrating a method for manufacturing the FET according to the first embodiment. FIG. 5 is a diagram briefly showing an ALD (Atomic-Layer Deposition) system to be used for manufacturing the FET according to the first embodiment. FIG. 6 is a diagram explaining a method for supplying material gas or a like employed in the ALD system of FIG. 5. FIG. 7 is a diagram explaining a method for supplying material gas or a like employed in the ALD system of FIG. 5. FIG. 8 is a characteristic diagram briefly showing a relation between a distance from the interface of the gate insulating film on the side of the substrate and a hafnium concentration "Nh" obtained before heat treatment in the gate insulating film making up the FET of the first embodiment. FIG. 9 is a diagram explaining characteristics of the FET of the first embodiment.

The MIS-type FET 1, as shown in FIG. 1, includes a silicon substrate 3 having a source-drain region 2 into which specified impurities are implanted is formed, a seed layer 4 made of silicon oxide ($SiO_2$) deposited on the silicon substrate 3, a gate insulating film 5 made of amorphous hafnium aluminate (hafnium aluminate $Hf_xAl_yO_z$, where, x:y:z indicates a composition ratio of hafnium aluminate made up of hafnium atom, aluminum atom and oxygen atom, that is, a ratio of a number of atoms among Hf, Al and O) deposited on the seed layer 4, and a gate electrode 6 made of, for example, polycrystalline silicon (p-Si) formed on the gate insulating film 5.

The gate insulating film 5 has a specified thickness (for example, 20 Å to 50 Å, that is, about 2 nm to 5 nm) and is so formed that the above composition ratio changes along a direction of its thickness toward the gate electrode 6 from a side of the silicon substrate 3, thus causing a hafnium concentration "Nh" to monotonously become lower and an aluminum concentration "Na" to monotonously become higher. That is, in a region in the vicinity of the seed layer 4 in the gate insulating film 5, a ratio $[x/(x+y)]$ of a number of hafnium atoms to a sum of the number of aluminum atoms and hafnium atoms in the hafnium aluminate, which represents a hafnium concentration "Nh", is set to be 50% to 80% and, in a region in the vicinity of the gate electrode 6 in the gate insulating film 5, a ratio $[y/(x+y)]$ of a number of aluminum atoms to a sum of numbers of aluminum atoms and hafnium atoms in the hafnium aluminate, which represents an aluminum concentration "Na", is set to be 50% to 100%.

The gate insulating film 5 of the first embodiment is so formed that, both in a region 5a on a lower layer side of the gate insulating film 5 (a first insulating region, that is, the region occupying about three fourths of all the thickness of the gate insulating film 5) and in a region 5b on an upper layer side of the gate insulating film 5 (a second insulating region, that is, the region occupying about one fourth of all thickness of the gate insulating film 5), each of the hafnium and the aluminum has a specified concentration being almost constant, the hafnium concentration "Nh" being different from the aluminum concentration "Na", and in a boundary region 5c formed between the region 5a on the lower layer side of the gate insulating film 5 and the region 5b on the upper layer side of the gate insulating film 5, each of the hafnium concentration "Nh" and aluminum concentration "Na" continuously and sharply changes. For example, as shown in FIG. 2, the hafnium concentration "Nh" is set to be 75% in the region 5a on the lower side of the gate insulating film 5 and is set to be 25% in the region 5b on its upper layer side and is set so as to continuously change from 75% to 25% in the boundary region 5c, that is, third insulating region with a distance "d" from an interface of the gate insulating film 5 (the region 5a) on a side of the silicon substrate 3 being within a range of distances $[(d1 \leq d \leq d2)]$. Here, "d1" represents a thickness of the region 5a, and "d2" represents a distance from the interface of the region 5a on a side of the silicon substrate 3 to an interface of the region 5b on a side of the silicon substrate 3. On the other hand, the aluminum concentration "Na" is set to be 25% in the region 5a on the lower layer side of the gate insulating film 5 and is set to be 75% in the region 5b on its upper layer side and a relation of $[Na[\%]=100-Nh]$ is maintained. Moreover, in FIG. 2, a sign "dg" represents a distance up to an interface of the gate insulating film 5 on a side of the electrode.

Next, a method for manufacturing the FET 1 of the first embodiment is described by referring to FIG. 3A to FIG. 8.

Figure 3A:
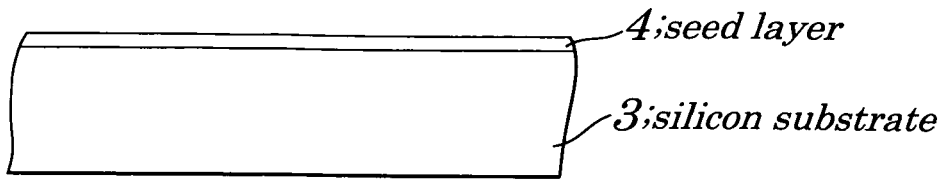
FIGS. 3A to 3D are process diagrams illustrating a method for manufacturing the FET according to the first embodiment.
Figure 3B:
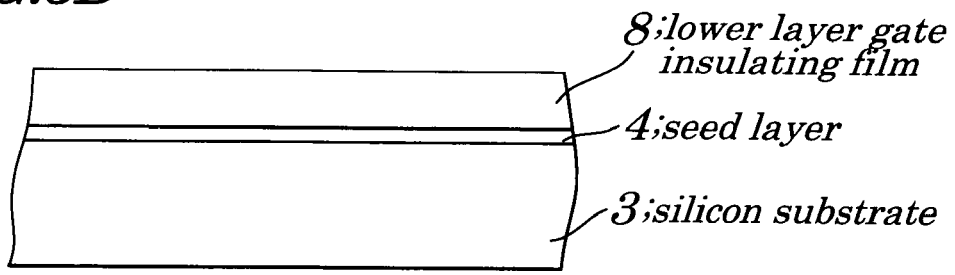

First, as shown in FIG. 3A, after a device isolation insulating film (not shown) has been formed on the silicon substrate 3 by using the LOCOS (Local Oxidation of Silicon) method or an STI (Shallow Trench Isolation) method, the seed layer 4 made of silicon oxide having a thickness of 3 Å to 8 Å, for example, that is, about 0.3 nm to 0.8 nm is formed on the silicon substrate 3 by a thermal oxidation method. Next, as shown in FIG. 3B, the lower layer gate insulating film (first insulating film) 8 made of hafnium aluminate containing a specified concentration of hafnium and aluminum is formed on the seed layer 4 by an ALD (Atomic-Layer Deposition) method. That is, the silicon substrate 3 on which the seed layer 4 is deposited is put into an ALD system 11 shown in FIG. 5 in which an aluminum oxide layer and a hafnium oxide layer are continuously formed and stacked, layer by layer, in a specified sequence so as to have a specified composition.

The ALD system 11 is made up of a vacuum container 12 in which a specified degree of vacuum is maintained, a heating table 13 on which a workpiece (substance) to be treated is put, gas introducing pipes 14a, 14b, 14c, and 14d to be used for introducing material gas or a like into the vacuum container 12, and a gas exhausting pipe 16 attached on a side opposite to a side on which the material gas is introduced into the vacuum container 12 and being connected to a vacuum pump 15. TMA (Trimethyl aluminum, $Al(CH_3)_3$), hafnium tetrachloride ($HfCl_4$), and ozone ($O_3$) are introduced, as the material gas, into the vacuum container 12 in the ALD system 11 through the gas introducing pipes 14a, 14b, and 14c, respectively, with timing being different from one another and repeatedly in a pulse-like manner and at specified periodical intervals at about 300° C. and the aluminum oxide layer and hafnium oxide layer are continuously formed and stacked, layer by layer, in a specified sequence in a manner so as to have a specified composition. Moreover, during a period after completion of the introduction of each material gas before introduction of subsequent same material gas or different material gas, nitrogen ($N_2$) is introduced as a purge gas through the gas introducing pipe 14d in a pulse-like manner.

In FIGS. 6 and 7, pulse-like waveforms "pa", "pb", "pC", and "pd" represent, respectively, flow rate of TMA, ozone, hafnium tetrachloride and nitrogen, which change with a passage of time "t". In the embodiment, as shown in FIG. 6, specified flow rate "Qa" of TMA is first introduced into the vacuum container 12 through the gas introducing pipe 14a during a gas introducing time "ta" ($t1 \leq t \leq t2$). Next, specified flow rate "Qd" of nitrogen is introduced as the purge gas into the vacuum container 12 through the gas introducing pipe 14d during a gas introducing time "td" ($t3 \leq t \leq t4$). Then, specified flow rate "Qb" of ozone is introduced as an oxidizing agent into the vacuum container 12 through the gas introducing pipe 14b during the gas introducing time "tb" ($t5 \leq t \leq t6$). Furthermore, specified flow rate "Qd" of nitrogen is introduced as the purge gas into the vacuum container 12 through the gas introducing pipe 14d during the gas introducing time "td" ($t7 \leq t \leq t8$). By these operations, one layer (1 mono-layer) of aluminum oxide is formed.

Next, specified flow rate "Qc" of hafnium tetrachloride is introduced into the vacuum container 12 through the gas introducing pipe 14c during the gas introducing time "tc" ($t9 \leq t \leq t10$). Then, specified flow rate "Qd" of nitrogen is introduced as the purge gas into the vacuum container 12 through the gas introducing pipe 14d during the gas introducing time "td" ($t11 \leq t \leq t12$). Next, specified flow rate "Qb" of ozone is introduced as an oxidizing agent into the vacuum container 12 through the gas introducing pipe 14b during the gas introducing time "tb" ($t13 \leq t \leq t14$). Furthermore, specified flow rate "Qd" of nitrogen is introduced as the purge gas into the vacuum container 12 through the gas introducing pipe 14d during the gas introducing time "td" ($t15 \leq t \leq t16$). By these operations, one layer (1 mono-layer) of hafnium oxide is formed.

Next, operations of the introduction of hafnium tetrachloride, nitrogen, ozone, and nitrogen described above are repeated twice in addition. That is, by introducing hafnium tetrachloride during the gas introducing time "tc" ($t17 \leq t \leq t18$), nitrogen during the gas introducing time "td" ($t19 \leq t \leq t20$), ozone during the gas introducing time "tb" ($t21 \leq t \leq t22$), and again nitrogen during the gas introducing time "td" ($t23 \leq t \leq t24$), additional one layer (1 mono-layer)

of hafnium oxide is formed. Then, by introducing hafnium tetrachloride during the gas introducing time (t25≦t≦t26), nitrogen during the gas introducing time (t27≦t≦t28), ozone during the gas introducing time (t29≦t≦t30), and again nitrogen during the gas introducing time (t31≦t≦t32), further additional one layer (1 mono-layer) of hafnium oxide is formed.

Thus, since three layers (3 mono-layers) of hafnium oxide are deposited on one layer (1 mono-layer) of aluminum oxide, the hafnium aluminate layer having a specified composition ratio is formed when viewed macroscopically. In the embodiment as shown in FIG. 6, time "ts" (=t33−t1) required for the formation of the one layer (1 mono-layer) of aluminum oxide and three layers of hafnium oxide is set to be several seconds. Then, the above formation process of the one layer (1 mono-layer) of aluminum oxide and three layers of hafnium oxide is repeatedly performed. By these operations, the lower layer gate insulating film 8 made of amorphous hafnium aliminate having a specified composition ratio is formed when viewed macroscopically.

Figure 3C:
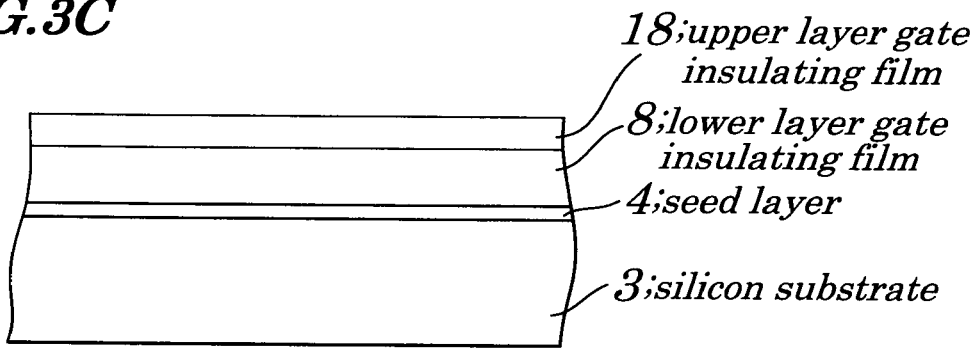

Next, as shown in FIG. 3C, an upper layer gate insulating film (second insulating film) 18 made of amorphous hafnium aliminate containing a specified concentration of hafnium and aluminum is formed on the lower layer gate insulating film 8 by the ALD method. That is, as shown in FIG. 7, specified flow rate "Qc" of hafnium tetrachloride is introduced into the vacuum container 12 through the gas introducing pipe 14c during the gas introducing time "tc" (t51≦t≦t52). Next, specified flow rate "Qd" of nitrogen is introduced as a purge gas into the vacuum container 12 through the gas introducing pipe 14d during the gas introducing time "td" (t53≦t≦t54). Then, specified flow rate "Qb" of ozone is introduced as an oxidizing agent into the vacuum container 12 through the gas introducing pipe 14b during the gas introducing time "tb" (t55≦t≦t56). Furthermore, specified flow rate "Qd" of nitrogen is introduced as the purge gas into the vacuum container 12 through the gas introducing pipe 14d during the gas introducing time "td" (t57≦t≦t58). By these operations, one layer (1 mono-layer) of hafnium oxide is formed.

Next, specified flow rate "Qa" of TMA is introduced into the vacuum container 12 through the gas introducing pipe 14a during the gas introducing time "ta" (t59≦t≦t60). Then, specified flow rate "Qd" of nitrogen is introduced as the purge gas into the vacuum container 12 through the gas introducing pipe 14d during the gas introducing time "td" (t61≦t≦t62). Then, specified flow rate "Qb" of ozone is introduced as the oxidizing agent into the vacuum container 12 through the gas introducing pipe 14b during the gas introducing time "tb" (t63≦t≦t64). Furthermore, specified flow rate "Qd" of nitrogen is introduced as the purge gas into the vacuum container 12 through the gas introducing pipe 14d during the gas introducing time "td" (t65≦t≦t66). By these operations, one layer (1 mono-layer) of aluminum oxide is formed. Next, operations of the introduction of TMA, nitrogen, ozone, and nitrogen described above are repeated twice in addition. That is, by introducing TMA during the gas introducing time "ta" (t67≦t≦t68), nitrogen during the gas introducing time "td" (t69≦t≦t70), ozone during the gas introducing time "tb" (t71≦t≦t72), and again nitrogen during the gas introducing time "td" (t73≦t≦t74), additional one layer (1 mono-layer) of aluminum oxide is formed. Then, by introducing TMA during the gas introducing time "ta" (t75≦t≦t76), nitrogen during the gas introducing time "td" (t77≦t≦t78), ozone during the gas introducing time "tb" (t79≦t≦t80), and again nitrogen during the gas introducing time "td" (t81≦t≦t82), further additional one layer (1 mono-layer) of aluminum oxide is formed.

Thus, since three layers of aluminum oxide are deposited on one layer (1 mono-layer) of hafnium oxide, the hafnium aluminate layer having a specified composition ratio is formed when viewed macroscopically. In the embodiment as shown in FIG. 7, time "ts" (=t83−t51) required for the formation of the one layer (1 mono-layer) of hafnium oxide and three layers (3 mono-layers) of aluminum oxide is set to be several seconds. Then, the above formation process of the one layer (1 mono-layer) of hafnium oxide and three layers of aluminum oxide is repeatedly performed. By these operations, the upper layer gate insulating film 18 made of amorphous hafnium aliminate having a specified composition ratio is formed when viewed macroscopically. Moreover, in the embodiment, a film thickness of the upper layer insulating film 18 is about one third or more of that of the lower layer gate insulating film 8.

Figure 3D:
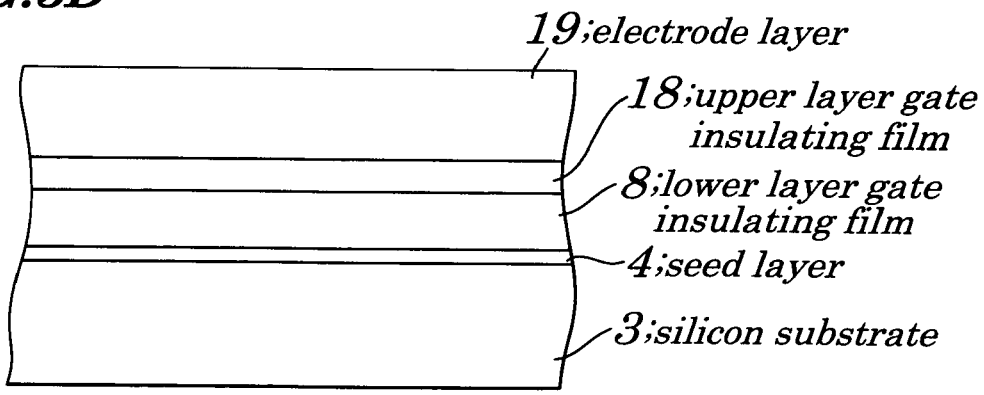

Next, a gate electrode made of, for example, polycrystalline silicon is deposited on the upper layer gate insulating film 18. That is, as shown in FIG. 3D, an electrode layer 19 made of polycrystalline silicon (p-Si) having a film thickness of, for example, 50 Å (5 nm) is deposited on the upper layer gate insulating film 18 by using a CVD (Chemical Vapor Deposition) method.

Next, as shown in FIG. 4A, a gate electrode 6 is formed by performing patterning operations using photolithography and etching technology. As shown in FIG. 8, a hafnium concentration "Nh" is set to be, for example, 75% in the lower layer gate insulating film 8, that is, in a region with a distance "d" from an interface of the lower layer gate insulating film 8 on a side of the substrate being within a range of (0≦d≦da) and to be, for example, 25% in the upper layer gate insulating film 18, that is, in a region with a distance "d" from an interface of the lower layer gate insulating film 8 on a side of the substrate being within a range of (da≦d≦dg) and is set so as to be discontinuously change at a boundary region (d=da). Here, "da" represents a thickness of the lower layer gate insulating film 8, and "dg" represents a total thickness of the lower layer gate insulating film 8 and the upper layer gate insulating film 18. In this case, an aluminum concentration "Na" is set to be 25% in the lower layer gate insulating film 8 and to be 75% in the upper layer gate insulating film 18 and a relation of [Na [%]=100−Nh] is maintained.

Then, after specified impurities have been implanted into the silicon substrate 3 by using the gate electrode 6 as a mask, an annealing process is performed at a temperature of, for example, 1000° C. to form the source-drain region 2 as shown in FIG. 4B. Here, during the heat treatment in the process of the source—drain region formation, in a region in the vicinity of the boundary between the lower layer gate insulating film 8 and upper layer gate insulating film 18, the change in the concentration of hafnium or aluminum becomes mild due to thermal diffusion, as a result, causing the boundary to disappear and the single layer gate insulating film 5 to be formed. Thus, the FET 1 as shown in FIG. 1 is obtained.

Next, a characteristic in the region in the obtained FET 1 where the gate insulating film 5 is formed is described by referring to FIG. 1 and FIG. 9.

Especially in the region 5b on the upper layer side of the gate insulating film 5 shown in FIG. 1, since the region is positioned immediately below the gate electrode 6, the concentration of aluminum is set to be comparatively high. This enables prevention of degradation of the EOT of the gate insulating film 5 caused by use of polycrystalline silicon (polycrystalline semiconductor) as the material for the gate electrode 6 and by use of only hafnium oxide as the material for the gate insulating film 5 and thus enables suppression of lowering in electrostatic capacitance, which serves to reduce leakage currents. Moreover, since the gate insulating film 5 contains a specified concentration of hafnium, lowering of a dielectric constant of the entire gate insulating film 5 is suppressed, which serves to ensure a required EOT. Also, since, in the region 5a on the lower layer side of the gate insulating film 5, the hafnium concentration "Nh" is set to be relatively high, lowering in the dielectric constant of the entire gate insulating film 5 is suppressed, thus serving to ensure the required EOT and, at the same time, since a specified concentration of aluminum is contained, crystallization of hafnium oxide can be prevented. Therefore, occurrence of a grain boundary passing through the gate insulating film 5 can be suppressed, thus serving to prevent an increase in leakage currents.

Moreover, an investigation of a relation between the EOT and leakage current density made to evaluate a characteristic of the FET 1 shows good results as shown in FIG. 9. In FIG. 9, a characteristic curve "L1" shows a relation between the EOT and the leakage current density in the FET 1 of the embodiment. Also, a characteristic curve "La" shows a relation between the EOT and the leakage current density obtained when metals are used as the material for the gate electrode 6 and the gate insulating film 5 is made up of only hafnium oxide. Furthermore, characteristic curves "Lb", "Lc", and "Ld" show relations between the EOT and the leakage current density obtained when polycrystalline silicon is used as the material for the gate electrode 6 and the gate insulating film 5 is made up of only hafnium oxide, only aluminum oxide, and only silicon oxide, respectively. As shown in FIG. 9, in the case of the FET 1 of the embodiment, the EOT is greatly reduced when compared with the case where the gate insulating film 5 is made up of only hafnium oxide, and its characteristic comes near to that obtained when metals are used as the material for the gate electrode 6 and the gate insulating film 5 is made up of only hafnium oxide.

Thus, according to the configurations of the FET of the embodiment, since, in the region 5a on the lower layer side of the gate insulating film 5 whose thickness occupies about three fourths of all thickness of the gate insulating film 5, the concentration of hafnium being a material having a high dielectric constant is made comparatively high and since, also in the region 5b on the upper layer side of the gate insulating film 5, hafnium is contained in a specified concentration, it is possible to suppress lowering of the dielectric constant of the entire gate insulating film 5 and to ensure the required EOT. Moreover, since, in the region 5b on the upper layer side of the gate insulating film 5, the concentration of aluminum is made comparatively high and since, in the region immediately below the gate electrode 6, the aluminum concentration "Na" is made particularly high, when polycrystalline silicon (polycrystalline semiconductor) is used as the material for the gate electrode 6 and the gate insulating film 5 is made up of only hafnium oxide, it is possible to suppress lowering of an electrostatic capacitance, that is, to prevent degradation of the EOT, and to reduce leakage currents.

Also, not only in the region 5b on the upper layer side of the gate insulating film 5, but also in the region 5a on the lower layer side of the gate insulating film 5 in which the concentration of hafnium is set to be relatively high, aluminum is contained in a specified concentration, which enables crystallization of hafnium oxide to be suppressed. As a result, occurrence of a grain boundary passing through the gate insulating film 5 can be suppressed and an increase in leakage currents can be prevented. This enables dielectric breakdown to be reduced, thus improving reliability of the semiconductor device. Also, since crystallization of hafnium oxide can be suppressed, surface roughness can be improved and a local concentration of electric fields in a region in which film thickness is small can be avoided, which enables leakage currents to be reduced, thus improving reliability of the semiconductor device.

Moreover, by providing heat treatment after the upper layer gate insulating film 18 has been deposited on the lower layer gate insulating film 8, the aluminum concentration "Na" and hafnium concentration "Nh" can be made changeable continuously in the boundary region, it is possible to prevent such a problem as a decrease in a threshold value of the gate insulating film 5 caused by trapped electric charges in the boundary region. Also, since the ALD method is used to form the gate insulating film 5, improvement of film quality of the gate insulating film 5 is made possible by precisely controlling concentrations of aluminum and hafnium and contamination caused by carbon contained in the material gas can be prevented by introducing the purge gas.

Second Embodiment

Figure 10:
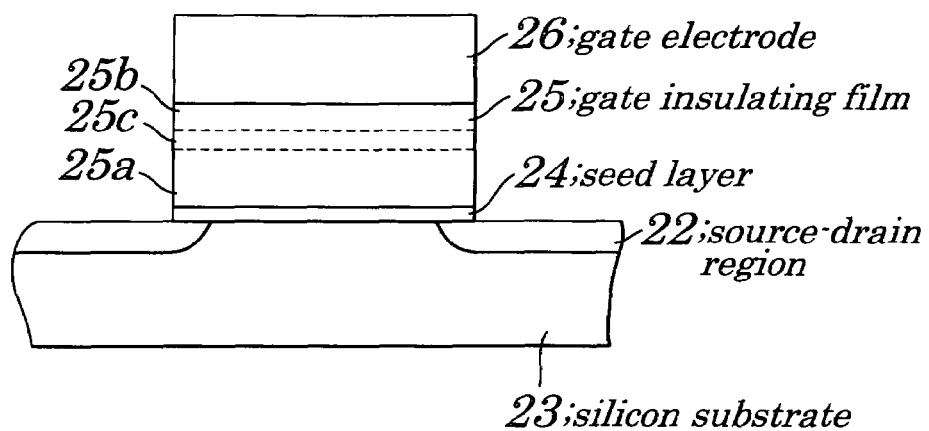
FIG. 10 is a cross-sectional view schematically illustrating featured configurations of main portions of an FET according to a second embodiment of the present invention.
Figure 11:
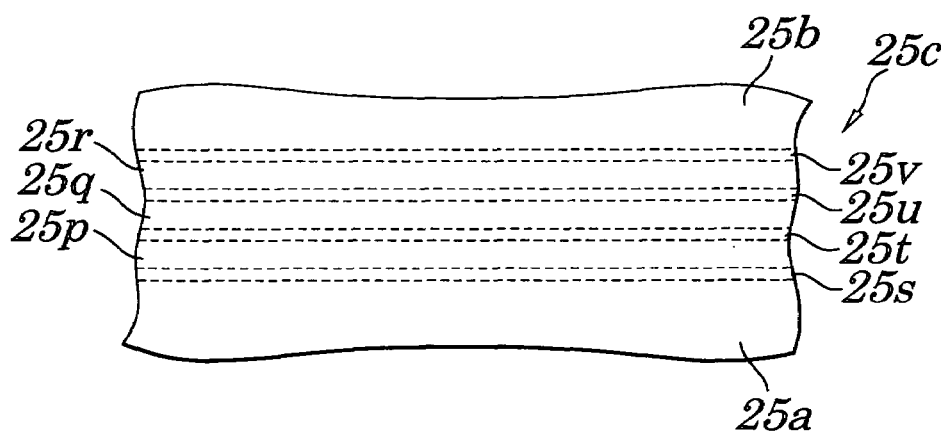
FIG. 11 is a cross-sectional view schematically illustrating configurations of intermediate regions in a gate insulating film of the FET according to the second embodiment of the present invention.
Figure 12:
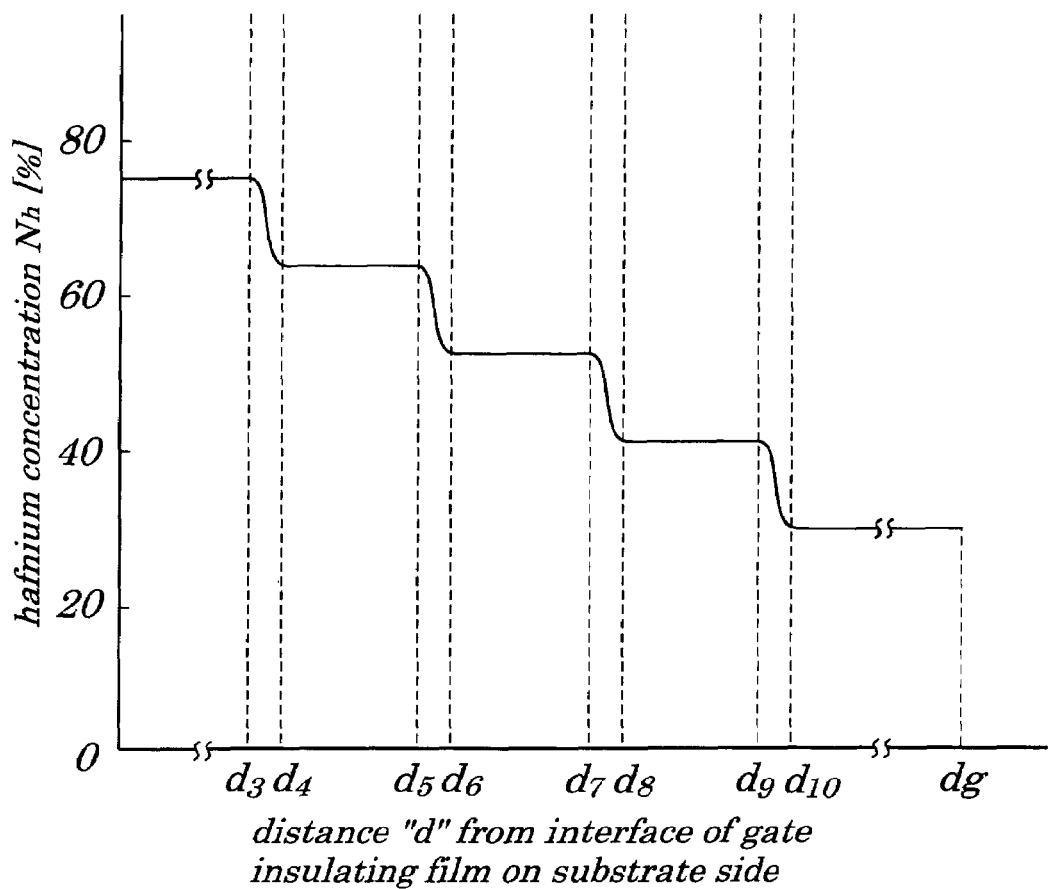
FIG. 12 is a characteristic diagram briefly showing a relation between a distance from an interface of the gate insulating film on a substrate side in the gate insulating film making up the FET and a hafnium concentration obtained after heat treatment in the gate insulating film making up the FET according to the second embodiment.
Figure 13A:
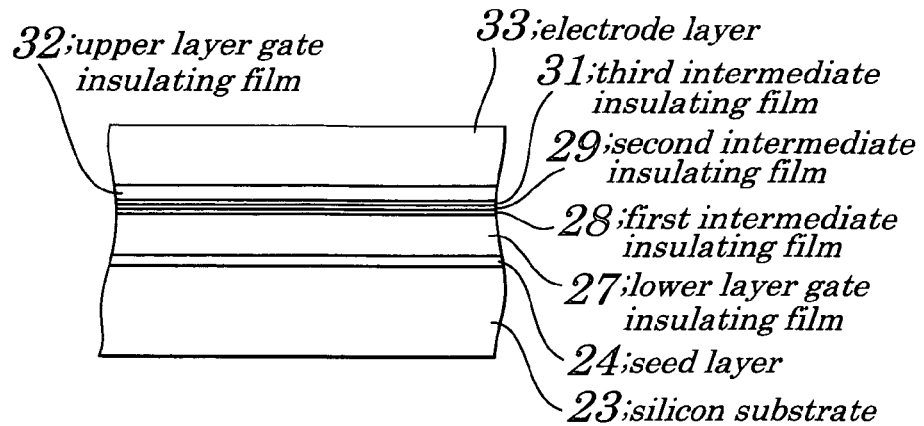
FIGS. 13A, 13B and 13C are process diagrams illustrating a method for manufacturing the FET according to the second embodiment.
Figure 13B:
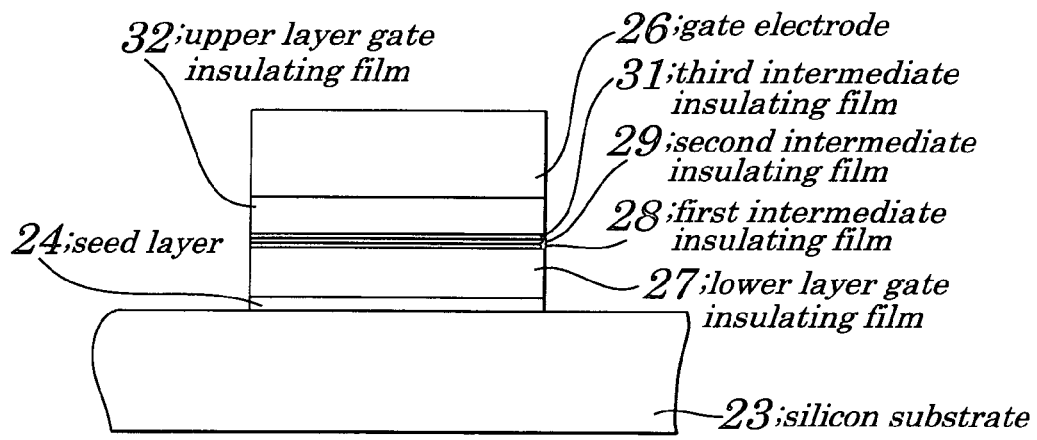
Figure 13C:
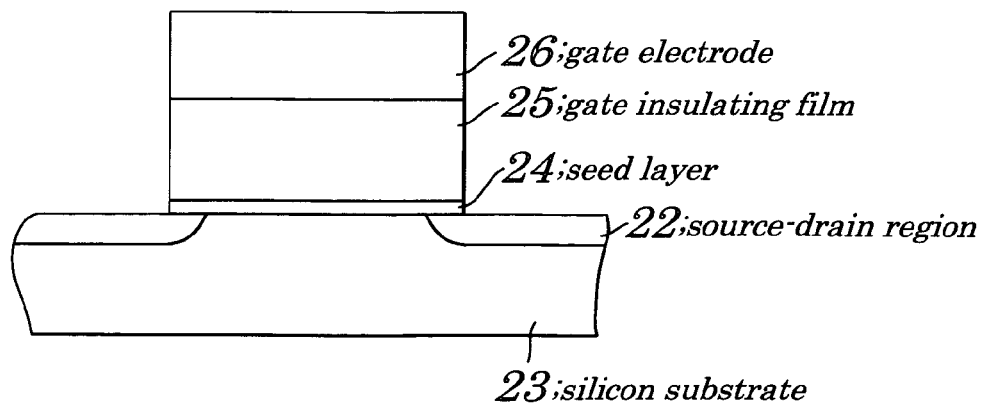
Figure 14:
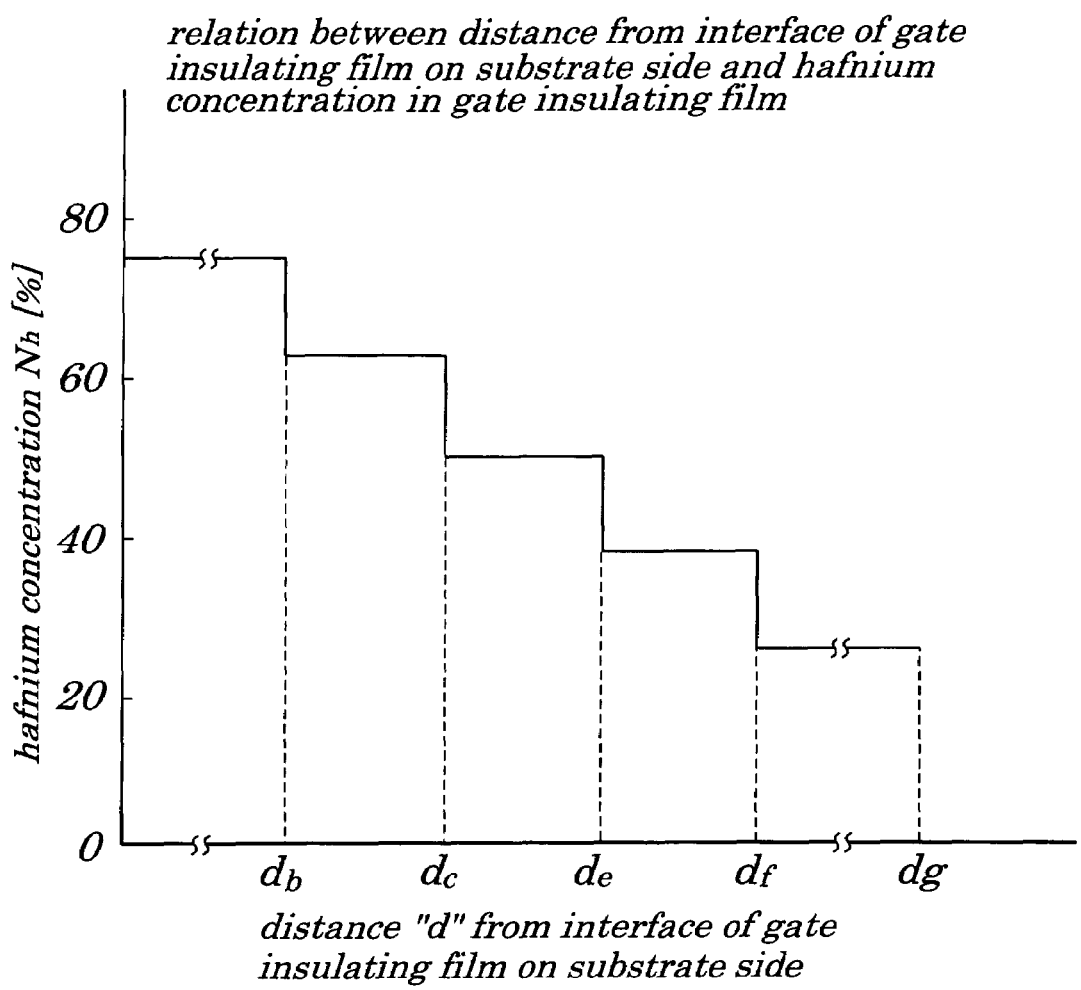
FIG. 14 is a characteristic diagram briefly showing a relation between a distance from the interface of the gate insulating film on the substrate side in the gate insulating film making up the FET obtained before heat treatment in the gate insulating film making up the FET according to the second embodiment.
Figure 15:
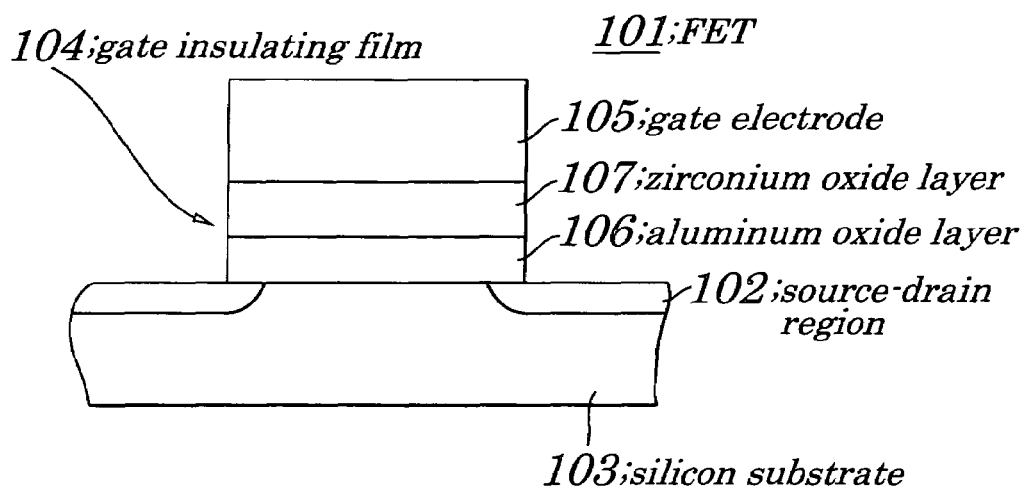
FIG. 15 is a diagram explaining a conventional technology.
Figure 16:
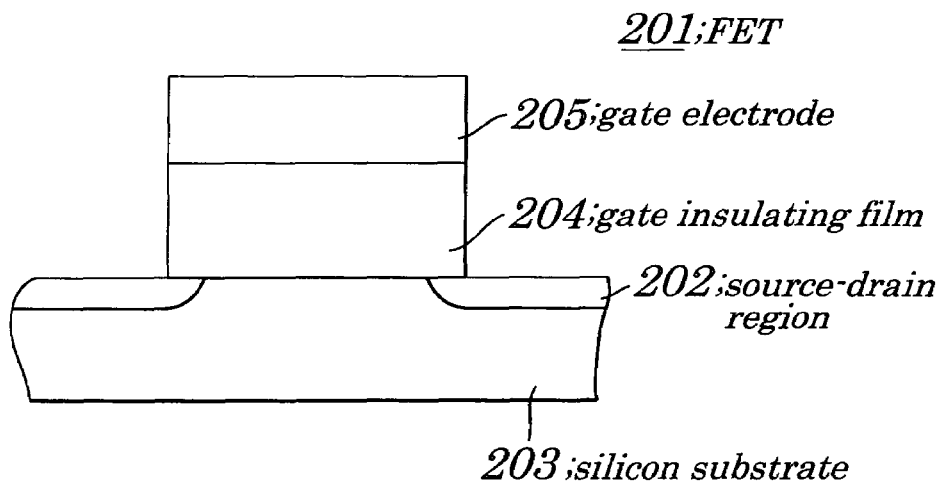
FIG. 16 is a diagram for explaining another conventional technology.
Figure 17:
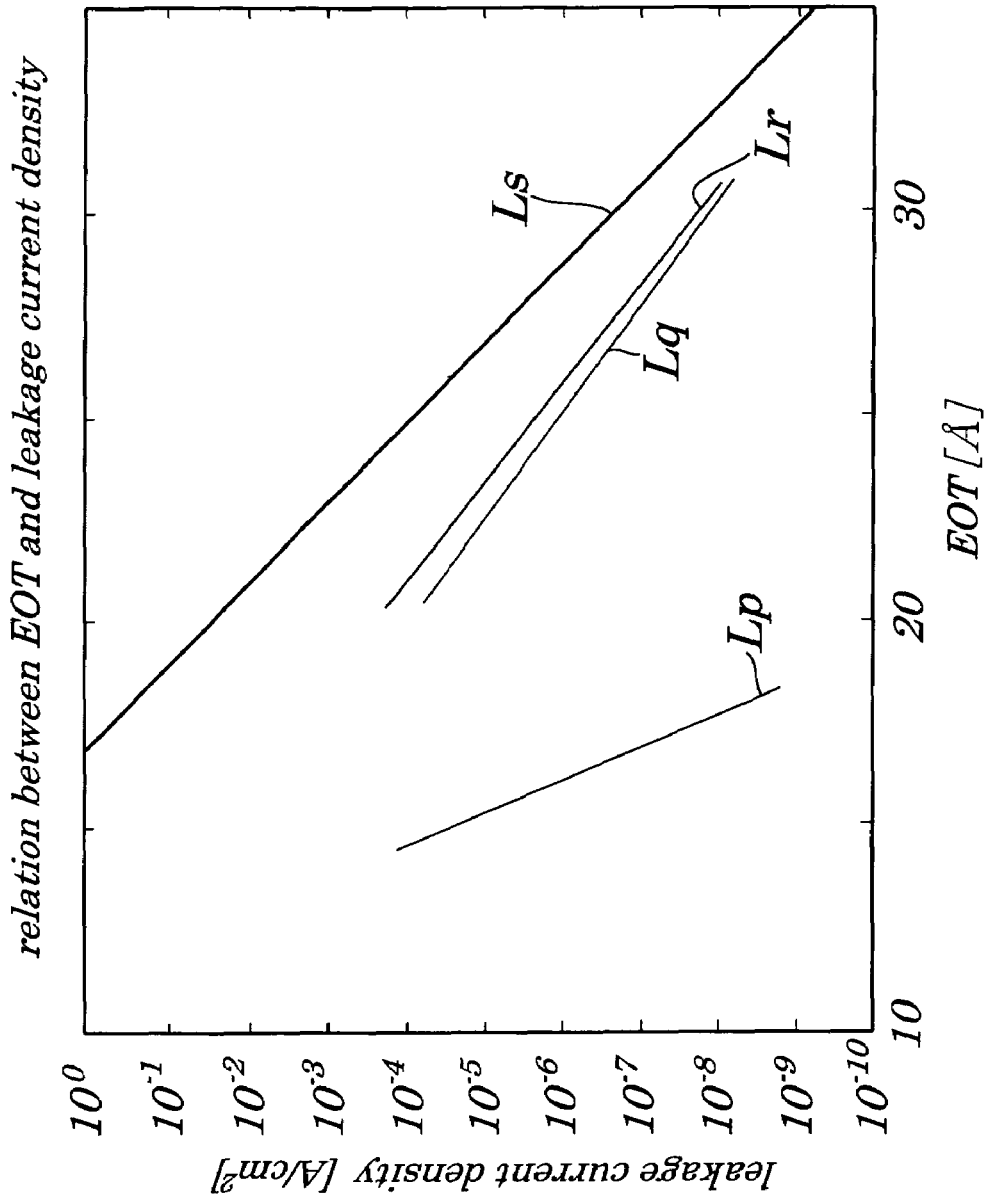
FIG. 17 is a diagram for explaining the other conventional technology.

FIG. 10 is a cross-sectional view for schematically illustrating configurations of main portions of an FET according to a second embodiment of the present invention. FIG. 11 is a cross-sectional view schematically illustrating configurations of intermediate regions in a gate insulating film of the FET 21 of the second embodiment. FIG. 12 is a characteristic diagram briefly showing a relation between a distance from an interface of the gate insulating film on a substrate side in the gate insulating film making up the FET 21 and a hafnium concentration "Nh" obtained after heat treatment in the gate insulating film making up the FET 21 of FIG. 10. FIGS. 13A, 13B and 13C are process diagrams illustrating a method for manufacturing the FET 21 of FIG. 10. FIG. 14 is a characteristic diagram briefly showing a relation between a distance from the interface of the gate insulating film on the substrate side in the gate insulating film making up the FET 21 and a hafnium concentration "Nh" obtained before heat treatment in the gate insulating film making up the FET 21 of FIG. 10.

The FET 21 of the second embodiment differs greatly from the FET 1 employed in the first embodiment in that, in the first embodiment, after the lower layer insulating film 8 and upper layer insulating film 18 have been formed, concentrations are continuously changed at the boundary region 5c in a process of heat treatment, however, in the second embodiment, after a plurality of intermediate insulating films whose hafnium concentration "Nh" and aluminum concentration "Na" are changed in stages has been formed between a lower gate insulating film and an upper gate insulating film and a heat treatment process is performed. Configurations other than described above are almost the same as those in the first embodiment and their descriptions are made simple accordingly.

The FET (semiconductor device) 21 of the second embodiment, as shown in FIG. 10, includes a silicon substrate 23 having a source—drain region 22 into which specified impurities have been implanted is formed, a seed layer 24 made of silicon oxide being deposited on the silicon substrate 23, a gate insulating film 25 formed on the seed layer 24, a gate electrode 26 made of, for example, polycrystalline silicon being deposited on the gate insulating film 25.

The gate insulating film 25 has a specified thickness (for example, 20 Å to 50 Å, that is, about 2 nm to 5 nm) and is so formed that each of composition ratios changes along a direction of its thickness toward the gate electrode 6 from a side of the silicon substrate 23, thus causing a hafnium concentration "Nh" to monotonously become lower and an aluminum concentration "Na" to monotonously become higher. Moreover, as shown in FIG. 10, the gate insulating film 25 has a region 25a (first insulating region) on a lower layer side immediately above the silicon substrate 23, a region 25b (second insulating region) on an upper layer side immediately below the gate electrode 26, and an intermediate region 25c (third insulating region) being sandwiched between the region 25a on the lower layer side and the region 25b on the upper layer side and both the hafnium concentration "Nh" and aluminum concentration "Na" are almost constant in each of the region 25a on the lower layer side and the region 25b on the upper layer side.

As shown in FIG. 11 and FIG. 12, the intermediate region 25c ($d3 \leq d \leq d10$) has a first intermediate region 25p ($d4 \leq d \leq d5$), a second intermediate region 25q ($d6 \leq d \leq d7$), a third intermediate region 25r ($d8 \leq d \leq d9$), a boundary region 25s ($d3 \leq d \leq d4$) between the region 25a on the lower layer side and the first intermediate region 25p, a boundary region 25t ($d5 \leq d \leq d6$) between the first intermediate region 25p and the secondary intermediate region 25q, a boundary region 25u ($d7 \leq d \leq d8$) between the second intermediate region 25q and the third intermediate region 25r, and a boundary region 25v ($d9 \leq d \leq d10$) between the third intermediate region 25r and region 25b on the upper layer side. Here, in the first intermediate region 25p, second intermediate region 25q, and third intermediate region 25r, each of the hafnium and the aluminum has a specified concentration being almost constant, and in the boundary region 25s, the boundary region 25t, the boundary region 25u, and the boundary region 25v, each of the hafnium concentration "Nh" and aluminum concentration "Na" continuously changes. As shown in FIG. 12, the hafnium concentration "Nh" is set to be, for example, 75% in the region 25a on the lower layer side in the gate insulating film 25 and to be, for example, 25% in the region 25b on the upper layer side in the gate insulating film 25 and changes continuously and in stages in the intermediate region 25c. In this case, the aluminum concentration "Na" is set to be 25% in the region 25a on the lower layer side in the gate insulating film 25 and to be 75% in the region 25b on the upper layer side in the gate insulating film 25 and a relation of (Na=100−Nh) is maintained.

Next, a method for manufacturing the FET 21 of the second embodiment is described by referring to FIG. 13.

First, as shown in FIG. 13A, a seed layer 24 made of silicon oxide is formed on a silicon substrate 23 by the thermal oxidation method. Then, a lower layer gate insulating film 27 made of hafnium aluminate containing a specified concentration of hafnium and aluminum is formed on the seed layer 24 by the ALD method. Then, the first intermediate insulating film (third insulating film) 28, second intermediate insulating film (third insulating film) 29, third intermediate insulating film (third insulating film) 31 are formed on the lower layer gate insulating film 27 in a manner that the hafnium concentration "Nh" becomes lower in order (the aluminum concentration "Na" becomes higher in order). Next, the upper layer gate insulating film 32 whose hafnium concentration "Nh" is made lower than that of the third intermediate insulating film 31 is formed on the third intermediate insulating film 31. Then, an electrode layer 33 made of polycrystalline silicon is formed on the upper layer gate insulating film 32, for example, by the CVD method. Then, as shown in FIG. 13B, a gate electrode 26 is formed by performing patterning operations using photolithography and etching technology. As shown in FIG. 14, the hafnium concentration "Nh" is set to be, for example, 75% in the lower layer gate insulating film 27, that is, in a region with a distance "d" from an interface of the gate insulating film 27 on a side of the substrate being within a range of ($0 \leq d \leq db$) and to be, for example, 25% in the upper layer gate insulating film 32, that is, in a region with a distance "d" from an interface of the gate insulating film 27 on a side of the substrate being within a range of ($df \leq d \leq dg$), and is set to be a specified constant value so as to become lower in order within a range of ($25\% \leq Nh \leq 75\%$) in each of the first intermediate insulating film 28, that is, in a region within a range of ($db \leq d \leq dc$), the second intermediate insulating film 29, that is, in a region within a range of ($dc \leq d \leq de$), and the third intermediate insulating film 31 ($de \leq d \leq df$) and is set so as to discontinuously change in each of the boundary regions (d=db, dc, de, and df). In this case, the aluminum concentration "Na" is set to be 25% in the lower layer gate insulating film 27 and to be 75% in the upper layer gate insulating film 32 and a relation of Na [%]=100−Nh is maintained.

Then, after specified impurities have been implanted into the silicon substrate 23 by using the gate electrode 26 as a mask, an annealing process is performed to form a source-drain region 22 as shown in FIG. 13C. Here, during the heat treatment in the process of the source—drain region formation, in a region in the vicinity of a boundary between the lower layer gate insulating film 27 and the first intermediate insulating film 28, in a region in the vicinity of a boundary between the first intermediate insulating film 28 and the second intermediate insulating film 29, in a region in the vicinity of a boundary between the second intermediate insulating film 29 and the third intermediate insulating film 31, and in a region in the vicinity of the third intermediate insulating film 31 and the upper layer gate insulating film 32, the change in the concentrations of hafnium or aluminum becomes mild due to thermal diffusion, causing the boundary to disappear and, as a result, the single layer gate insulating film 25 to be formed. Thus, the FET 21 as shown in FIG. 10 is obtained.

According to the second embodiment, almost the same effect as achieved in the first embodiment described above can be obtained. Additionally, since the change in concentrations in the boundary region is made more mild, the characteristic can be more improved.

It is apparent that the present invention is not limited to the above embodiments but may be changed and modified without departing from the scope and spirit of the invention. For example, in the above embodiments, the gate insulating films 5 and 25 are formed by the ALD method, however, instead of the ALD method, the CVD method can be used for forming the gate insulating films 5 or 25. This enables a throughput (processing capability) to be improved. The CVD method that can be used here includes, for example, an atmospheric CVD method, a reduced pressure CVD method, a plasma enhanced CVD method, or a like. Moreover, the gate electrode can be formed as a multi-layer structure in which metals layers are stacked on a polycrystalline layer. Polycrystalline silicon-germanium [SiGe], instead of polycrystalline silicon, can be used as a material for the gate electrode.

The material gas that can be used when the gate insulating films 5 or 25 are formed by the ALD method includes Hf $(NMe_2)_4$ [tetrakis(dimethylamino)hafnium], Hf $(NEt_2)_4$ [tetrakis(diethylamino)hafnium], Hf $(NMeEt)_4$ [tetrakis(methylethylamino)hafnium], Hf $(t-Bu)_4$ [tetra t-butyl hafnium] instead of $HfCl_4$ [hafnium tetrachloride]. Also, as the oxidizing agent, instead of ozone ($O_3$), oxygen ($O_2$) or water ($H_2O$) may be used. The formation of the seed layer 4 or 24 may be omitted. In the above embodiments, by the thermal treatment in the process of forming the source-drain region, the concentration of hafnium or aluminum is changed continuously in a region in the vicinity of the boundary between the lower layer gate insulating film 8 and the upper layer gate insulating film 18. However, to make continuous the change in the concentration of hafnium or aluminum, a thermal treatment in a process of forming a gate electrode may be used or a thermal treatment process to make mild the change in the concentration of hafnium or aluminum may be provided separately. The temperature for the thermal treatment is set to be within a range between 800° C. or more and 1000° C. or less.

Also, in the above first embodiment, the boundary region $5c$ is formed where the hafnium concentration "Nh" and aluminum concentration "Na" are continuously changed along a thickness direction of the gate insulating film 5 by the thermal treatment, however, the FET of the present invention may be so constructed as to have an interface, instead of the boundary region $5c$. Moreover, in the first embodiment, each of the hafnium concentration "Nh" and the aluminum concentration "Na" is constant in the region $5a$ on the lower layer side of the gate insulating film 5 and the region $5b$ on the upper layer side of the gate insulating film 5, however, the present invention is not limited to this, that is, the FET may be constructed so that the hafnium concentration "Nh" becomes lower and the aluminum concentration "Na" becomes higher in these regions $5a$ and $5b$ along a direction from a side of the substrate to a side of the gate electrode. In the first embodiment, the thickness of the region $5a$ on the lower layer side of the gate insulating film 5 occupies about three fourths and the thickness of the region $5b$ on the upper layer side of the gate insulating film 5 occupies about one fourth, however, the present invention is not limited to this, that is, a ratio of the thickness of the upper layer region $5b$ may be made higher.

Furthermore, in the second embodiment, the three layers of the intermediate insulating films each having a different hafnium concentration "Nh" and aluminum concentration "Na" are formed, however, the present invention is not limited to this, that is, two layers or four layers or more of the intermediate insulating films may be formed.

What is claimed is:

1. A method for manufacturing a semiconductor device comprising:
   forming a silicon oxide layer on a substrate;
   an insulating film forming process of forming an insulating film made of metal oxide containing aluminum and hafnium on said silicon oxide layer; and
   an electrode forming process of forming an electrode on said insulating film;
   wherein said insulating film forming process includes a first insulating film forming process of forming a first insulating film being hafnium-rich on said silicon oxide layer and a second insulating film forming process of forming a second insulating film being aluminum-rich on said first insulating film and wherein, in said electrode forming process, said electrode is formed on said second insulating film.

2. The method for manufacturing a semiconductor device according to claim 1, wherein said metal oxide to be used in said insulating film forming process is made of amorphous metal oxide and said electrode to be formed in said electrode forming process is made of a polycrystalline semiconductor.

3. The method for manufacturing a semiconductor device according to claim 1, wherein a thickness of said insulating film is 2 nanometers or more and 5 nanometers or less.

4. The method for manufacturing a semiconductor device according to claim 1, further comprising a thermal treatment process of changing, at least continuously, said aluminum concentration and hafnium concentration along a direction of a thickness of said insulating film by performing said thermal treatment process after said electrode forming process.

5. The method for manufacturing a semiconductor device according to claim 1, wherein, in said insulating film forming process, said insulating film is formed by an atomic-layer deposition (ALD) method.

6. The method for manufacturing a semiconductor device according to claim 1, wherein, in said insulating film forming process, said insulating film is formed by a chemical vapor deposition (CVD) method.

7. The method for manufacturing a semiconductor device according to claim 1, wherein said thermal treatment process is performed in an electrode forming process or in a source-drain region forming process after said electrode forming process.

8. The method for manufacturing a semiconductor device according to claim 1, wherein, in said insulating film forming process, said insulating film is so formed that a hafnium concentration decreases monotonously or step by step, whereas an aluminum concentration increases monotonously or step by step along a direction of a thickness of said insulating film from a side of said substrate toward a side of said electrode.

9. The method for manufacturing a semiconductor device according to claim 8, wherein, in said first insulating film forming process, said first insulating film is so formed that a ratio of hafnium atoms to a sum of a number of aluminum atoms and hafnium atoms in said first insulating region is 0.5 or more and 0.8 or less and, in said second insulating film forming process, said second insulating film is so formed that a ratio of aluminum atoms to a sum of a number of aluminum atoms and hafnium atoms in said second insulating region is 0.5 or more and 1.0 or less.

10. The method for manufacturing a semiconductor device according to claim 8, wherein a ratio of a thickness of said second insulating region to a thickness of said first insulating region is set to be ⅓ or more and 1.0 or less.

11. The method for manufacturing a semiconductor device according to claim 1, further comprising a third insulating film forming process of forming a third insulating film in which concentrations of hafnium and aluminum contained in said metal oxide change along a direction of a thickness of said insulating film between said first insulating film and said second insulating film.

12. The method for manufacturing a semiconductor device according to claim 11, wherein, in said first insulating film forming process, said first insulating film is so formed that a ratio of hafnium atoms to a sum of a number of aluminum atoms and hafnium atoms in said first insulating region is 0.5 or more and 0.8 or less and, in said second insulating film fonning process, said second insulating film is so formed that a ratio of aluminum atoms to a sum of a number of aluminum atoms and hafnium atoms in said second insulating region is 0.5 or more and 1.0 or less.

13. The method for manufacturing a semiconductor device according to claim 11, wherein a ratio of a thickness of said second insulating region to a thickness of said first insulating region is set to be ⅓ or more and 1.0 or less.

* * * * *